United States Patent [19]

Flesner

[11] Patent Number: 4,902,967

[45] Date of Patent: Feb. 20, 1990

[54] SCANNING ELECTRON MICROSCOPY BY PHOTOVOLTAGE CONTRAST IMAGING

[75] Inventor: Larry D. Flesner, La Jolla, Calif.

[73] Assignee: The United States of America as represented by the Secretary of the Navy, Washington, D.C.

[21] Appl. No.: 353,722

[22] Filed: May 18, 1989

[51] Int. Cl.⁴ .................. G01R 31/28; G01R 31/26
[52] U.S. Cl. ......................... 324/158 R; 250/311; 250/492.2; 324/158 D
[58] Field of Search ........... 324/158 R, 158 D, 158 T, 324/73 R; 250/310, 311, 492.2, 492.3

[56] References Cited

U.S. PATENT DOCUMENTS

| | | | |
|---|---|---|---|
| 3,939,415 | 2/1976 | Terasawa | 324/158 D |
| 4,581,534 | 4/1986 | Todokoro et al. | 324/158 D |
| 4,695,794 | 9/1987 | Bargett et al. | 324/158 R |
| 4,704,576 | 11/1987 | Tributsch et al. | 324/158 R |

FOREIGN PATENT DOCUMENTS 0045465  3/1982  Japan ........................... 324/158 R

OTHER PUBLICATIONS

Menzel et al; "Secondary Electron . . . "; Scanning; vol. 5; pp. 151–171; 1983.

Primary Examiner—Ernest F. Karlsen
Attorney, Agent, or Firm—Harvey Fendelman; Thomas Glenn Keough; Michael A. Kagan

[57] ABSTRACT

A process and apparatus are disclosed for remotely determining electrical properties of a semiconductor. A surface of the semiconductor is simultaneously irradiated with an electron beam to generate secondary electrons from the irradiated surface and with a modulated light beam. Secondary electrons emitted by the semiconductor are filtered by an electron energy analyzer. An electron detector receives the filtered electrons and provides an output corresponding to electrical properties of the irradiated area. The output is provided to a computer which calculates the difference in output between periods when the semiconductor is being illuminated with the light beam and when it is not so illuminated. The time dependence of the output may also be measured.

25 Claims, 1 Drawing Sheet

SCANNING ELECTRON MICROSCOPY BY PHOTOVOLTAGE CONTRAST IMAGING

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to the field of contactless measurements of electrical properties of semiconductors, and more particularly, to contactless measurement of the electrical properties of a semiconductor by remotely sensing a photovoltage effect induced on the semiconductor by a modulated light source by measuring resultant changes in the energy spectrum of secondary electrons which are excited by a primary electron beam that irradiates the semiconductor. In semiconductor material and semiconductor device development, it is important to be able to observe or detect the electrical properties of different regions of the semiconductor. Such properties may include surface voltage or electric field strength resulting from external stimuli. Detection of these properties is useful for assuring the quality of electrical networks implemented at various stages of fabrication processing. Electrical property variations affecting the quality of such networks are associated with dopant variations, the presence of impurities, defects, or other sample properties.

One method for detecting the electrical properties in different regions of semiconductors uses a point probe or other physical contact to make electrical measurements on the surface of the semiconductor sample material. However, there are several disadvantages with this method. The resolution of this method is limited by the contact probe dimensions which are often much greater than the regions which one may wish to probe. Another disadvantage is that this method is tedious to implement because each region to be tested must be individually contacted. Furthermore, the semiconductor surface may be damaged from contact with the probe. A serious limitation with this method is that some materials cannot be contacted by simply pressing contact probes on their surfaces. For example, gallium arsenide requires special processing to enable electrical contact with the semiconductor material. Due to the surface states of gallium arsenide, non-ohmic contact probes on the surface of the gallium arsenide result in Schottky barriers. Electrical measurements of selected regions of this material require formation of ohmic contacts by techniques which may involve evaporation and annealing of materials such as gold, germanium, and nickel on the gallium arsenide surface to form an alloy which eliminates the Schottky barriers.

In general, remote systems for measuring the electrical potential of local regions on integrated circuits are well known. These types of systems detect secondary electrons emitted from the surface of a test sample which is irradiated with an electron beam. Such techniques have been discussed extensively in the literature in articles such as "Secondary Electron Detection Systems for Quantitative Voltage Measurements", Menzel, E., and Kubalek, E., *Scanning*, Vol. 5, pp. 151-171, FACM Publishing, Inc. (1983).

U.S. Pat. No. 4,220,854 issued to Feuerbaum on Sept. 2, 1980 disclosed a method for contactless measurement of the potential wave form in an electronic component. A pulsed electron beam from an electron beam microscope is directed over the surface of a semiconductor sample. The pulsed radiation on the sample surface produces modulated secondary electrons. These secondary electrons are captured by an analyzer unit and guided to a detector. The signal produced by the detector is directed through a lock-in amplifier and then displayed on a picture screen.

Federal Republic of Germany Pat. No. DE 29 02 495 A1, assigned to Siemens, discloses a device for contactless potential measurement. The device uses a primary electron beam to release secondary electrons at the measurement point of an electronic component such as an integrated circuit.

Federal Republic of Germany Pat. No. DE 3331931 A1, assigned to Siemens, discloses an apparatus for measuring potential of an electronic circuit having a passivation layer. The apparatus uses electron or light scanning to perform electron beam measurement techniques. The passivation layer is scanned with low energy electrons at video frequency or with light to release electrons from the layer.

"Voltage-Contrast Detector for Scanning Electron Microscopy", by Touw, T. R., *IBM Technical Disclosure Bulletin*, Vol. 15, No. 8, Jan. 1973, discloses a modification to a voltage-contrast detector of the type described by J. R. Bandury and W. C. Nixon in *J. Sci. Inst.* Ser. 2 Vol., 2, pp. 1055-1059. The IBM device includes a planar element at specimen potential located above the specimen with an aperture to admit a primary electron beam on to the specimen and to allow secondary electrons to enter an electron detector. The aperture size may be varied to extend the voltage range of monotonic response in voltage contrast and decreases the effect on due to transverse electric fields at the specimen.

"Scanning Electron Beam Probe VLSI Chips", by Fazekas, P., Feuerbaum, H. P., and Eckhard, W., *Electronics*, Vol. 54, No. 14, July 14, 1981, discloses a non-contacting test method for plotting logic-state maps of the operation of integrated circuits. This method is implemented by scanning the entire surface of an integrated chip with an electron beam to utilize the well established voltage-contrast technique to produce areas of light and dark which results in an image representing logic voltage levels of the chip.

The references identified above show how it is possible to measure or observe voltages on semiconductor device circuits using the non-contacting method of electron beam irradiation and secondary electron energy analysis. However, these teachings do not address the problem of how to induce voltages into semiconductor samples for measurement. One method for exciting voltages on a semiconductor is to apply the voltages via electrical contacts physically connected to the test sample. This method is commonly practiced, but disadvantageously requires that the semiconductor sample be in a relatively finished stage of circuit fabrication. Often, it is desirous to ascertain the quality of an electrical network being manufactured on a semiconductor substrate before actual completion of the network. However, there is no present method for doing so. Therefore, a need exists for a non-contact method of determining electrical properties of semiconductor samples at various stages of fabrication so that defects of material or manufacture can be more readily identified and discovered earlier than present methods allow.

SUMMARY OF THE INVENTION

The present invention provides a process and apparatus for measuring and mapping the spatial and temporal dependence of the photovoltaic response of electrically active regions of a semiconductor in various stages of fabrication without contacting the semiconductor. The semiconductor is illuminated with a modulated light beam while being irradiated with an electron beam at specific regions which are desired to be examined. Electron beam irradiation causes secondary electrons to be emitted from the surface of the semiconductor. The modulated light beam produces a photovoltaic effect at the semiconductor surface which causes the energy spectrum of the secondary electrons to be modified. A secondary electron analyzer selectively filters low energy from high energy secondary electrons. The filtered secondary electrons then are received by an electron detector which provides an output functionally related to the quantity of detected secondary electrons. The electron detector output is amplified and provided to a computer which calculates the difference between the output obtained when the semiconductor is being illuminated with the light beam and the output obtained while the semiconductor is not being illuminated with the light beam. This difference is indicative of the electrical properties related to the photovoltaic effect of the specific region of semiconductor being examined. The computer also may be used to control the deflection coils of the scanning electron microscope in order to direct the electron beam and to control modulation of the laser diode. In this way, output variations of the detector may be synchronously correlated with the beam position and the illumination intensity. Time and space dependent variations of the output resulting from the illumination of the sample are measured, recorded and displayed by instruments which are connected to the computer and to the electron detector.

The present invention overcomes the shortcomings of the prior art scanning systems by providing spatial mapping and time dependent measurements of the photovoltaic response of specific regions of the sample. Prior art systems measure voltages applied to the sample via electrical contacts, rather than voltages induced by modulated light, as does the present invention.

Therefore, it is an object of the invention to provide a process for detecting electrical properties of a semiconductor without physically contacting the semiconductor. Another object of the present invention is to provide a process for measuring the spatial dependence of the photovoltaic response of the semiconductor. Another object of the present invention is to provide a process for measuring the time dependence of the photovoltaic response of the semiconductor. A further object of the present invention is to provide an apparatus which can measure electrical properties of an electrical network being implemented on a semiconductor in various stages of completion.

DESCRIPTION OF THE PREFERRED EMBODIMENT

Figure 1:
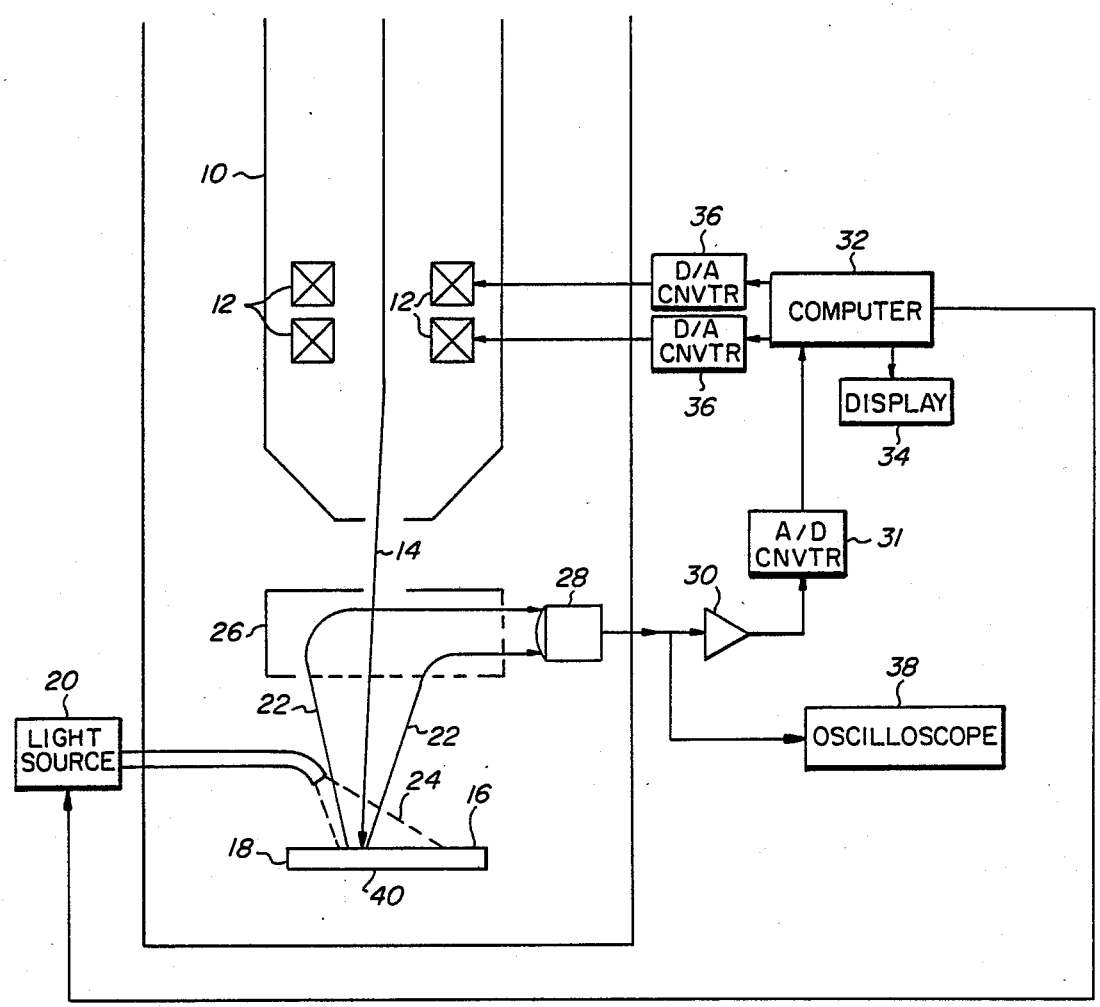
FIG. 1 is a diagram the present invention.

Referring to FIG. 1, an electron beam source such as scanning electron microscope 10 having deflection coils 12 generates electron beam 14 which is directed to irradiate top surface 16 of semiconductor 18. The energy level of electron beam 14 may be several thousand keV. Simultaneously, light source 20, which may for example be a laser diode, illuminates selected areas of surface 16 with light beam 24. The interaction of electron beam 14 with surface 16 produces secondary electrons 22 to be emitted from surface 16. The energy spectra of the secondary electrons 22 is modified by the photovoltaic effect caused by illuminating surface 16 with light beam 24. Secondary electrons 22 pass through secondary electron analyzer 26 and then are directed to secondary electron detector 28. Electron analyzer 26 is selectively adjustable to filter secondary electrons 22 having various kinetic energies by techniques well known to those skilled in this art. Electron analyzers are well known by those skilled in this technology. For example, a suitable analyzer may be Model ED 02, manufactured by LINTECH Instruments, Ltd., Cambridge, England. Another suitable electron analyzer is a retarding field spectrometer manufactured by Integrated Circuit Testing GmbH, Otto-Han Strasse 28-30/IV, D-8012 Ottobrunn-Riemerling, Federal Republic of Germany. Secondary electron detector 28 receives secondary electrons 22 and provides an electrical output functionally related to the quantity of filtered secondary electrons 22. A suitable type of secondary electron detector is an Everhart-Thornley which is well known by those skilled in this technology.

Still referring to FIG. 1, the analog output of secondary electron detector 28 is directed to amplifier 30 where it is amplified and then directed to analog-to-digital converter 31 which provides a digitized input to computer 32. Computer 32 also provides an output to light source 20 in order to modulate light beam 24, a technique well known by those skilled in this technology. The wave form of light 24 is preferably a square wave, although the scope of the invention also comprehends the use of other modulated wave forms. For example, the wave form may be a saw tooth or sinusoidal, or be of any other pulsed form. Computer 32 also provides separate digital outputs to digital-to-analog converters 36 which provide analog voltage outputs which are suitably buffered by techniques well known by those skilled in this art to control deflection coils 12 so as to direct electron beam 14 to specific regions of surface 16 that are desired to be examined. Computer 32 is operated so as to synchronize the reading of the output of secondary electron detector 28 with modulation of light beam 24 so that dependence of the measured data on the intensity of light beam 24 may be known and recorded. Synchronous detection results from computer 32 reading and comparing the digitized output of secondary electron detector 28 when surface 16 is being illuminated with light beam 24 and when surface 16 is not being illuminated by light beam 24. A photovoltaic effect is induced in semiconductor 18 when it is illuminated with light beam 24. The energy spectra of secondary electrons 22 will differ depending on the presence or absence of the photovoltaic effect. Computer 32 calculates and stores the signal differential resulting from this difference between the energy spectra. This difference is indicative of the electrical properties of the specific region of semiconductor 18 being examined. Spatial dependence of the output of secondary electron detector 28 may be measured by moving electron beam 14 in a suitable scan pattern and making one or more measurements at selected locations within the pattern.

The time dependence of the photovoltaic effect which follows a light pulse, may also be measured at selected locations by techniques well known to those skilled in this technology. For example, the output of secondary electron detector 28 optionally may be provided directly to oscilloscope 38, as well as being displayed on display 34, such as a graphic printer, after being conditioned by computer 32. The programming of a computer, such as computer 32, to control the direction of an electron beam is well known by those skilled in the art of electron microscopy. Furthermore, programming computer 32 to calculate the difference in digitized output of secondary electron detector 28, as previously discussed above, is well within the level of ordinary skill of those who practice within this field of technology.

Obviously, many modifications and variations of the present invention are possible in light of the above teachings. For example, the scope of the invention also includes directing electron beam 14 by manual input to control the voltage applied to deflection coils 1 by techniques well known to those skilled in this technology. In FIG. 1, light beam 24 is shown to illuminate surface 16 of semiconductor 18. However, the invention also contemplates illuminating the underside of semiconductor 18 on surface 40 where light source 20 is a Neodymium (Nd) YAG laser having an output with a wavelength of approximately 1.06 micrometers. This wavelength provides good penetration into silicon, yet is still able to induce a photovoltaic effect within that substance. In another variation of the present invention, rather than having computer 32 provide an output to modulate light source 20 as is shown in FIG. 1, light source 20 may provide an output to computer 32 which instructs computer 32 to read the digitized output of secondary electron detector 28. Therefore, it is to be understood that within the scope of the appended claims, the invention may be practiced otherwise than as specifically described.

I claim:
1. An apparatus for determining electrical properties of a semiconductor, comprising:
   first means for irradiating said semiconductor with an electron beam so that secondary electrons having energy spectra are emitted from said semiconductor;
   second means for illuminating said semiconductor with a modulated light beam and for inducing a photovoltaic effect in said semiconductor so that said energy spectra of said secondary electrons may be modified in accordance with said electrical properties of said semiconductor;
   third means positioned to receive said secondary electrons emitted from said semiconductor for selectively filtering said secondary electrons based on said energy spectra of said secondary electrons;
   fourth means positioned to receive said filtered secondary electrons for detecting said filtered secondary electrons and for providing an output functionally related to a quantity of said detected secondary electrons; and
   fifth means operably coupled to receive said output of said fourth means for synchronizing detection of said filtered secondary electrons to a first period when said semiconductor is being illuminated by said light beam and to a second period, alternate to said first period, when said semiconductor is not being illuminated by said light beam, and for determining a change of said output between said first and second periods.

2. The apparatus of claim 1 wherein:
said fifth means is operably coupled to said first means for directing said electron beam on selected regions of said semiconductor.

3. The apparatus of claim 2 which further includes:
an amplifier operably coupled between said fourth and fifth means for amplifying said output of said fourth means.

4. The apparatus of claim 3 wherein:
said fifth means provides an output functionally related to said difference.

5. The apparatus of claim 4 which further includes:
a display operably coupled to receive said output of said fifth means for presenting said output in human intelligible format.

6. The apparatus of claim 4 wherein:
said first means is a scanning electron microscope having deflection coils.

7. The apparatus of claim 4 wherein:
said second means is a laser diode.

8. The apparatus of claim 4 wherein:
said fourth means is an Everhart-Thornley detector.

9. The apparatus of claim 4 wherein:
said fifth means is a computer.

10. The apparatus of claim 4 wherein:
said computer provides an output to said deflection coils to direct said electron beam.

11. The apparatus of claim 4 wherein:
said light beam is square wave modulated.

12. The apparatus of claim 4 wherein:
said third means is an energy analyzer.

13. The apparatus of claim 2 further including:
sixth means operably coupled to receive said output from said fourth means for depicting a time dependence of said output.

14. The apparatus of claim 13 wherein:
said sixth means is an oscilloscope.

15. A process for determining electrical properties of a semiconductor, comprising the steps of:
   irradiating said semiconductor with an electron beam so that secondary electrons having energy spectra are emitted from said semiconductor;
   illuminating said semiconductor with a modulated light beam to induce a photovoltaic effect in said semiconductor so that said energy spectra of said secondary electrons may be modified in accordance with said electrical properties of said semiconductor;
   selectively filtering said secondary electrons based on said energy spectra of said secondary electrons;
   detecting said filtered secondary electrons in a first period when said semiconductor is being illuminated by said light beam and in a second period, alternate to said first period, when said semiconductor is not being illuminated by said light beam;
   providing an output functionally related to a quantity of said detected secondary electrons; and
   determining a change of said output between said first and second periods.

16. The process of claim 15 which further includes:
directing said electron beam to selected regions of said semiconductor.

17. The process of claim 16 which further includes:
modulating said light beam so that said light beam has a square wave form.

18. The process of claim 17 which further includes:

generating said light beam with a laser diode.

19. The process of claim 17 which includes: detecting said secondary electrons with an Everhart-Thornley detector.

20. The process of claim 17 which includes: irradiating said semiconductor with a scanning electron microscope.

21. The process of claim 17 which includes: determining said change of said output between said first and second periods with a computer.

22. The process of claim 17 which further includes: displaying said change between said energy spectra.

23. The process of claim 17 which includes: filtering said secondary electrons with an electron analyzer.

24. The process of claim 16 further including: determining a time dependence of said output.

25. The process of claim 24 wherein: determining said time dependence with an oscilloscope.

* * * * *